United States Patent
Muller et al.

(10) Patent No.: US 9,837,161 B2
(45) Date of Patent: Dec. 5, 2017

(54) SPLIT-GATE MEMORY HAVING SECTOR RETIREMENT WITH REDUCED CURRENT AND METHOD THEREFOR

(71) Applicant: FREESCALE SEMICONDUCTOR, INC., Austin, TX (US)

(72) Inventors: Gilles Muller, Austin, TX (US); Ronald J. Syzdek, Austin, TX (US)

(73) Assignee: NXP USA, Inc., Austin, TX (US)

( * ) Notice: Subject to any disclaimer, the term of this patent is extended or adjusted under 35 U.S.C. 154(b) by 24 days.

(21) Appl. No.: 15/064,813

(22) Filed: Mar. 9, 2016

(65) Prior Publication Data
US 2017/0263324 A1 Sep. 14, 2017

(51) Int. Cl.
| | | |
|---|---|---|
| G11C 16/06 | (2006.01) | |
| G11C 16/28 | (2006.01) | |
| G11C 16/08 | (2006.01) | |
| G11C 8/10 | (2006.01) | |
| G11C 8/08 | (2006.01) | |

(52) U.S. Cl.
CPC .............. *G11C 16/28* (2013.01); *G11C 16/08* (2013.01); *G11C 8/08* (2013.01); *G11C 8/10* (2013.01)

(58) Field of Classification Search
CPC .. G11C 16/08; G11C 8/10; G11C 8/08; G11C 16/30; G11C 19/28; G11C 8/18; G11C 11/415

USPC .......................... 365/185.23, 230.06, 189.11
See application file for complete search history.

(56) References Cited

U.S. PATENT DOCUMENTS

| | | | |
|---|---|---|---|
| 5,886,923 A | | 3/1999 | Hung |
| 5,966,332 A | * | 10/1999 | Takano ............... G11C 11/5621 365/185.28 |
| 6,577,534 B2 | | 6/2003 | Tsuruda |
| 6,603,702 B2 | * | 8/2003 | Kojima .................... G11C 8/08 365/185.11 |
| 8,971,147 B2 | | 3/2015 | Muller et al. |
| 9,013,927 B1 | | 4/2015 | Cunningham et al. |
| 9,053,993 B2 | * | 6/2015 | Yan ........................ H04N 5/345 |
| 9,111,639 B2 | | 8/2015 | Hong et al. |
| 2005/0166087 A1 | | 7/2005 | Gorobets |
| 2015/0127973 A1 | | 5/2015 | Porterfield |

* cited by examiner

*Primary Examiner* — David Lam
(74) *Attorney, Agent, or Firm* — Daniel D. Hill

(57) ABSTRACT

A memory is provided. The memory includes an array of non-volatile memory (NVM) cells arranged in a plurality sectors. A control gate driver circuit has an output coupled to control gates of the NVM cells in a sector in the plurality of sectors. An address decoder is coupled to the control gate driver circuit. And a latch circuit is coupled between the address decoder and the control gate driver circuit. The latch circuit stores a first value, and based on the stored first value, the control gate driver circuit output is floating.

20 Claims, 3 Drawing Sheets

| | CG | | |
|---|---|---|---|
| | SEL | USEL | RET |
| READ/IDLE | 1.5 V | | FLOAT |
| PROGRAM | 10 V | 1.5 V | FLOAT |
| ERASE | 15 V | 1.5 V | FLOAT |

SPLIT-GATE MEMORY HAVING SECTOR RETIREMENT WITH REDUCED CURRENT AND METHOD THEREFOR

BACKGROUND

Field

This disclosure relates generally to integrated circuit memories and more specifically to sector retirement for a split-gate memory.

Related Art

Some data processing systems may include various types of memory. For example, a volatile memory type that may be used is static random access memory (SRAM), and a non-volatile memory type that may be used is flash memory. Volatile memory types lose their stored states when powered down while non-volatile memory types retain their stored states. The different memory types have advantages and disadvantages. For example, SRAM has faster access times than most non-volatile memory types. Also, some non-volatile memory types have relatively poor program/erase cycling endurance. A thin film storage (TFS) non-volatile memory uses, for example, nanocrystals or silicon-oxide-nitride-oxide-silicon (SONOS) as the storage medium instead of a floating gate. One type of TFS non-volatile memory cell has both a control gate and a select gate and is commonly known as a split-gate memory cell. To access a split-gate memory cell both the control gate word line and the select gate word line of the cell are asserted.

Some areas of a memory array may be accessed more frequently than others, and thus will wear out faster. Memory life can be extended if the areas that wear out are "retired", or removed from service. In a flash memory, unselected, or retired array portions are biased at zero volts, or ground, in read mode. However, in one type of TFS split-gate memory design, when a sector is retired the unselected drivers of a retired sector are biased at a voltage greater than zero volts, meaning that certain defects in the sector can create an undesirable current path. The current path can lower the actual read voltage on the shared supply, thus lowering a supply voltage that is shared between the retired and active array portions. The lowered read voltage would result in a threshold voltage (VT) margin loss, and possibly read failures.

Therefore, a need exists for a non-volatile memory system that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
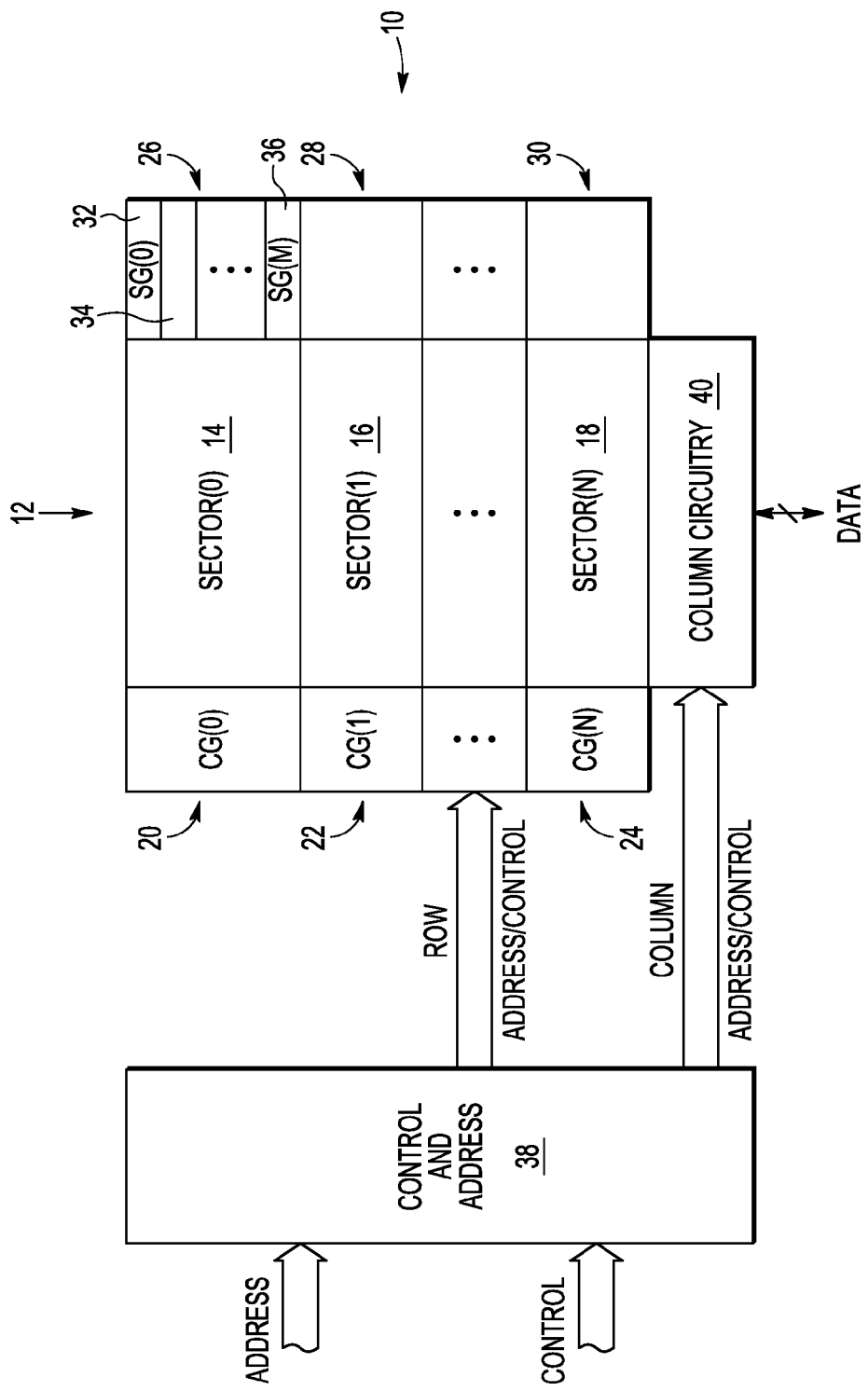
FIG. 1 illustrates, in block diagram form, a non-volatile memory in accordance with an embodiment.

Generally, there is provided, a non-volatile memory having an array of non-volatile memory cells organized in sectors. Each of the non-volatile memory cells has a control gate. A control gate driver is used to select the control gates of a sector of the memory cells when the sector is being accessed. The control gate driver includes a latch circuit connected between an address decoder and the control gates of a sector. When a sector of the array is retired, the latch circuit stores a first value, so than when the sector is unselected, an output of the control gate driver is floating, or disconnected from the control gates of the sector.

Floating the output of the control gate driver for a retired sector instead of biasing the output at a positive voltage prevents a potential current path from forming in the retired sector during, for example, a read operation of the array. This will allow for increased effective yield and program/erase cycling endurance. One or more defective sectors can be ignored with no impact on other sectors. Also, it is not necessary to design in extra margin, and the design is scalable to the retiring of multiple sectors.

In one embodiment, there is provided, a memory comprising: an array of non-volatile memory (NVM) cells arranged in a plurality sectors; a control gate driver circuit having an output coupled to control gates of the NVM cells in a sector in the plurality of sectors; an address decoder coupled to the control gate driver circuit; and a latch circuit coupled between the address decoder and the control gate driver circuit, the latch circuit storing a first value, wherein based on the stored first value, the control gate driver circuit output is floating. The latch circuit may store a second value, wherein based on the stored second value, the control gate driver circuit output is driven to a read voltage during a read operation. The stored first value may correspond to a retired sector and the stored second value corresponds to a non-retired sector. The control gate driver circuit may comprise a high side driver portion including two cascoded P-channel transistors, and a low side driver portion including two series coupled N-channel transistors. The memory may further comprise a first level shifter coupled between the address decoder and the high side driver portion of the control gate driver circuit. The high side driver portion may include two cascoded P-channel transistors that comprises a first cascode P-channel transistor coupled in series with a second cascode P-channel transistor, wherein the first cascode P-channel transistor may include a first current electrode coupled to a first supply voltage, a bulk electrode coupled to the first current electrode, and a control electrode coupled to receive an output of the first level shifter, and wherein the second cascode P-channel transistor may include a first current electrode coupled to a second current electrode of the first cascode P-channel transistor, a bulk electrode coupled to the first current electrode, a second current electrode coupled to the output of the control gate driver circuit, and a control electrode coupled to receive a first bias voltage. The memory may further comprise a second level shifter coupled between the latch circuit and the low side driver portion of the control gate driver circuit. The low side driver portion may include two series coupled N-channel transistors comprises a first N-channel transistor coupled in series with a second N-channel transistor, wherein the first N-channel transistor may include a first current electrode coupled to a second supply voltage, a bulk electrode coupled to a ground supply voltage, and a control electrode coupled to receive an output of the second level shifter, and wherein the second N-channel transistor may include a first current electrode coupled to a second current electrode of the first N-channel transistor, a bulk electrode coupled to the first current electrode, a second current electrode coupled to the output of the control gate driver circuit, and a control electrode coupled to receive a second bias voltage. The latch circuit may be a set-reset (S-R) latch comprising cross-coupled NAND gates.

In another embodiment, there is provided, a memory comprising: an array of non-volatile memory (NVM) cells configured in a plurality sectors; a plurality of control gate driver circuits each having an output coupled to control gates of the NVM cells in the plurality of sectors; a first address decoder coupled to a first control gate driver circuit in the plurality of control gate driver circuits; and a first latch circuit coupled between the first address decoder and the first control gate driver circuit, the first latch circuit storing a first value indicative of a retired sector in the plurality of sectors, wherein based on the stored first value, the first control gate driver circuit output is floating. The memory may further comprise: a second control gate driver circuit in the plurality of control gate driver circuits having an output coupled to control gates in a non-retired sector in the plurality of sectors; and a second latch circuit coupled to the second control gate driver circuit, the second latch circuit storing a second value different from the first value stored in the first latch, wherein based on the stored second value, the second control gate driver circuit output is driven to a read voltage during a read operation. The first and second latches may be reset during a reset operation of the memory. The second latch may be set to the first value when the non-retired sector is configured as a second retired sector. The first control gate driver circuit output may be floating during a read operation in the non-retired sector. Each of the control gate driver circuits may comprise a high side driver portion including two cascoded P-channel transistors, and a low side driver portion including two series coupled N-channel transistors. The memory may further comprise a first level shifter coupled between the first address decoder and the high side driver portion of the first control gate driver circuit, and a second level shifter may be coupled between the first latch circuit and the low side driver portion of the first control gate driver circuit.

In yet another embodiment, there is provided, a method of operating a memory comprising: providing an array of non-volatile memory (NVM) cells configured in a plurality sectors; coupling an output of a control gate driver circuit to control gates of the NVM cells in a sector in the plurality of sectors; coupling an address decoder to the control gate driver circuit; and storing a first value in a latch circuit coupled between the address decoder and the control gate driver circuit, wherein based on the stored first value, the control gate driver circuit output is floating. The first value stored in the latch circuit may indicate a retired sector in the plurality of sectors. The control gate driver circuit output may be floating during a read operation of a non-retired sector in the plurality of sectors. The method may further comprise storing a second value in the latch circuit, wherein based on the stored second value, driving the control gate driver circuit output to a read voltage during a read operation in a non-retired sector in the plurality of sectors.

Figures 3, 4:
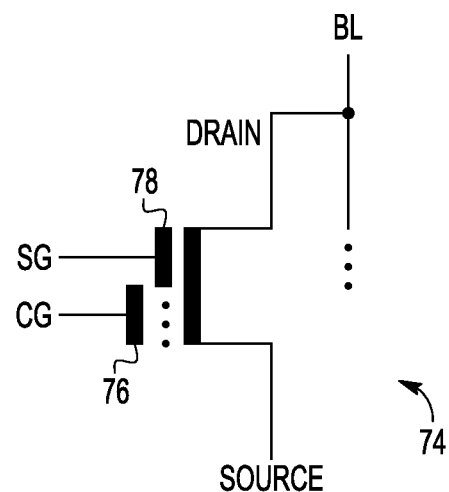
FIG. 3 illustrates, in schematic diagram form, a split-gate memory cell of the non-volatile memory of FIG. 1.
FIG. 4 illustrates a table of control gate voltages used during operation of the non-volatile memory of FIG. 1.

FIG. 1 illustrates, in block diagram form, non-volatile memory 10 in accordance with an embodiment. Non-volatile memory 10 includes non-volatile memory array 12, control gate drivers 20, 22, and 24, select gate drivers 26, 28, and 30, control and address circuitry 38, and column circuitry 40. Non-volatile memory array 12 includes N sectors, such as sectors 14, 16, and 18, where N is an integer. A control gate driver corresponds to each sector. In one embodiment, each sector includes a plurality of split-gate non-volatile memory cells organized in rows and columns. A schematic of a split-gate memory cell is illustrated in FIG. 3. Select gate drivers include a plurality of row select gate drivers such as row select gate drivers 32, 34, and 36 of select gate driver 26.

In one embodiment, each non-volatile memory cell is characterized as being a split-gate memory cell that includes both a select gate and a control gate. A memory cell is accessed by asserting a control gate word line and a select gate word line (not shown). That is, each row has two word lines and one bit line. For example, control gate driver 20 has an output terminal connected to the control gate word lines of sector 14, control gate driver 22 has an output terminal connected to the control gate word lines of sector 16, and control gate driver 24 has an output terminal connected to the control gate word lines of sector 18. Each of select gate drivers 26, 28, and 30 includes a plurality of select gate word line drivers, where each word line driver is connected to a select gate word line of a sector. For example, select gate drivers 26 includes M select gate word line drivers 32, 34, and 36, where M is an integer equal to the number of select gate word lines in sector 24. Column circuitry 40 includes column decode circuitry, sense amplifiers, and I/O circuitry for inputting and outputting data signals labeled "DATA" to the bit lines of the memory cells in array 12. Control and address circuitry 38 has a plurality of input terminals for receiving an address for determining the location of a select memory cell of array 12, a plurality of control signals labeled "CONTROL", a plurality of output terminals for providing row address and control information labeled "ROW ADDRESS/CONTROL" the control gate word lines and select gate word lines of array 12, and a plurality of output terminals for providing column address and control information labeled "COLUMN ADDRESS/CONTROL" to column circuitry 40. The row address and control information ROW ADDRESS/CONTROL is used by both the control gate drivers and select gate drivers during an access of memory 10.

An array of memory cells in a random access memory is typically organized as a plurality of equal sized portions of memory cells. The word "sector" is used herein to indicate a portion, or subset, of array 12. Other words may be just as applicable to describe a portion of memory cells, such as block, bank, quadrant, or a page of memory cells.

Figure 2:
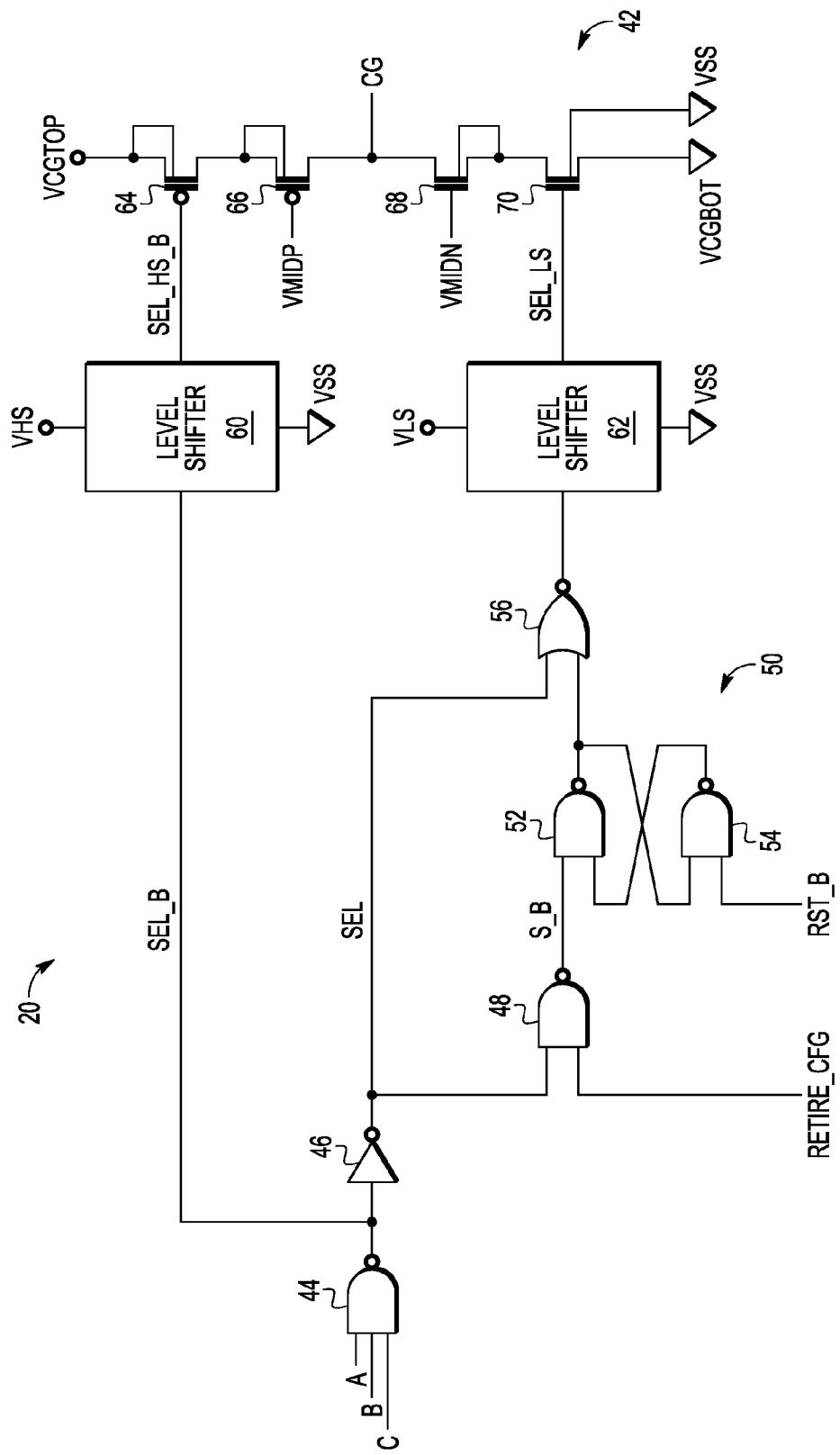
FIG. 2 illustrates, in partial schematic diagram form and logic diagram form, a control gate driver of the non-volatile memory of FIG. 1.

FIG. 2 illustrates, in partial schematic diagram form and partial logic diagram form, control gate driver 20 of the non-volatile memory of FIG. 1. Control gate drivers 20, 22, and 24 are identical in the illustrated embodiment. Control gate driver 20 includes NAND logic gates 44 and 48, inverter 46, latch circuit 50, NOR logic gate 56, high side level shifter 60 and low side level shifter 62, P-channel driver transistors 64 and 66, and N-channel driver transistors 68 and 70. Latch circuit 50 includes cross-coupled NAND logic gates 52 and 54.

NAND logic gate 44 has input terminals for receiving a sector address signals labeled "A", "B", and "C", and an output terminal for providing a select signal labeled "SEL_B". Note that a signal name followed by a "B" is a logical complement of a signal having the same name but lacking the "B". Inverter 46 has an input connected to the output of NAND logic gate 44, and an output for providing a select signal labeled "SEL". NAND logic gate 48 has a first input connected to the output of inverter 46, a second input for receiving a retire configuration signal labeled "RETIRE_CFG", and an output for providing signal "S_B". NAND logic gate 52 has a first input connected to the output of NAND logic gate 48, a second input, and an output. NAND logic gate 54 has a first input connected to the output of NAND logic gate 52, a second input for receiving a reset signal labeled "RST_B", and output connected to the second input of NAND logic gate 52. NOR logic gate 56 has a first input connected to the input of inverter 46 for receiving select signal SEL, a second input connected to the output of NAND logic gate 52, and an output.

Level shifter 60 has a first power supply voltage terminal for receiving a power supply voltage labeled "VHS", a second power supply voltage connected to ground and labeled "VSS", an input connected to the output of NAND logic gate 44, and an output for providing a high side select signal labeled "SEL_HS_B". Level shifter 62 has a first power supply voltage terminal for receiving a power supply voltage labeled "VLS", a second power supply voltage terminal connected to VSS, an input connected to the output of NOR logic gate 56, and an output for providing a low side select signal labeled "SEL_LS". Level shifters 60 and 62 receive a signal at one voltage level and upshift the voltage levels up to increased voltage levels. In another embodiment, level shifters 60 and 62 may downshift the signal levels to lower voltage levels. High side power supply voltage VHS is at a high voltage level than low side power supply voltage VLS.

Driver transistors 42 includes high side cascoded driver transistors 64 and 66 and low side series-connected driver transistors 68 and 70. P-channel driver transistor 64 has a source (current electrode) connected to a control gate top power supply voltage terminal labeled "VCGTOP", a gate (control electrode) connected to the output of level shifter 60, a drain (current electrode), and a body, or bulk electrode connected to control gate top power supply voltage terminal VCGTOP. P-channel transistor 66 has a source connected to the drain of P-channel transistor 64, a gate for receiving a bias voltage labeled "VMIDP", a source coupled to a control gate output labeled "CG", and a bulk electrode connected the drain of P-channel transistor 64. N-channel transistor 68 has a drain connected to output terminal CG, a gate for receiving a bias voltage labeled VMIDN, and a source and a bulk electrode connected together. N-channel transistor 70 has a drain connected to the source and bulk electrode of transistor 68, a gate for receiving low side signal SEL_LS, a source electrode connected to control gate bottom power supply voltage terminal VCGBOT, and a bulk electrode connected to VSS. P-channel transistor 66 and N-channel transistor 68 function as over voltage protection devices for driver transistors 64 and 70. The output terminal CG is connected to all of the control gates of a sector of array 12. Control gate top power supply voltage VCGTOP is at a higher voltage level than control gate bottom supply voltage VCGBOT. Both VCGTOP and VCGBOT are higher than power supply voltage VSS, which is at ground potential in the illustrated embodiment.

During an access to a location of memory 10, a sector, such as sector 14, is selected or unselected depending on the memory location being accessed for a read, write, program, or erase operation. Also, the voltage provided at top power supply voltage terminal VCGTOP is set depending on whether the access is a program, erase, or read access. For a selected sector, an address is provided to select the control gates and select gates of the accessed memory cells. Also, the relevant bit lines are selected. In the driver circuit of FIG. 2, select signal SEL is controlled independently of signal S_B using configuration signal RETIRE_CFG. If the address represented by signals A, B, and C selects, for example, for an access to sector 14, NAND logic gate 44 of control gate driver 20 provides a logic low select signal SEL_B. Inverter 46 will provide a logic high select signal SEL. If configuration signal RETIRE_CFG is a logic low, indicating normal operation, then NAND gate 48 will output a logic high. Reset signal RST_B is a logic high, so latch 50 provides the latch value to the second input of NOR logic gate 56. The latched value is a logic low out of reset, and stays low for a non-retired sector. Because the output of NAND gate 44 is a logic low, inverter 46 will provide a logic high signal SEL. NOR logic gate 56 will output a logic low to the input of level shifter 62. The logic low SEL_B output of NAND logic gate 44 is provided to level shifter 60. Level shifters 60 and 62 will shift the logic levels of the received signals by a predetermined amount depending on the supply voltage provided to the level shifters. The logic low output signal SEL_HS_B from level shifter 60 causes P-channel driver transistor 64 to be conductive and provide a current path from VCGTOP to output terminal CG. The logic low output signal SEL_LS causes N-channel driver transistor 70 to be substantially non-conductive. Output terminal CG is pulled to the voltage level of VCGTOP. The voltage level of output CG is determined by the voltage level of VCGTOP depending on whether the operation is a program or erase. P-channel transistor 66 and N-channel transistor 68 prevent gate oxide and junction damage due to excessive voltage. All of the control gates of a sector are connected to output terminal CG.

When a sector is retired, a predetermined logic value, such as a logic high, or logic one, is written to latch 50. The value written to latch 50 corresponds to the sector address of the retired sector. To write the logic high to latch 50, the sector addressing scheme is used to assert signal SEL. A RETIRE_CFG pulse is then provided to NAND logic gate 48. In response, NAND logic gate 48 provides a logic low signal S_B to an input of NAND logic gate 52. Because reset signal RST_B is a logic high after reset, a logic high is written to and stored in latch 50.

When sector 14 is not selected, or is unselected, during an access because the memory location being accessed is not in sector 14, NAND logic gate 44 will output a logic high select signal SEL_B. The logic high select signal SEL_B is provided to the P-channel drive transistor 64 via level shifter 60 and will cause P-channel drive transistor 64 to be substantially non-conductive. In response to receiving the logic high from the output of NAND logic gate 44, the output of inverter 46 provides a logic low select signal SEL to the first inputs of NAND logic gate 48 and NOR logic gate 56. During normal operation configuration signal RETIRE_CFG is not asserted, and is therefore provided as a logic low. The output S_B of NAND logic gate 48 is therefore a logic high. Reset signal RST_B is a logic high causing latch 50 to output its previously stored value. This value is a logic low for a non-retired sector. NOR logic gate 56 receives a logic low and select signal SEL is a logic low, causing NOR logic gate 56 to output a logic high. The logic high is level shifted by level shifter 62, and a level shifted logic high SEL_LS signal is provided to the gate of N-channel transistor 70. N-channel transistor 70 will be conductive causing output signal CG to be pulled to the voltage of bottom power supply voltage terminal VCGBOT. The voltage VCGBOT is provided to the control gates of all of the split-gate memory cells of unselected sector 14.

When the control gate output CG is floating for a retired sector, the floating signal CG is bound by the bulk connection+VT on the high end and the bulk connection−VT on the low end, where VT is a threshold voltage of the well-implant junction diode. In the instant case, VSS−VT<CG<VCGTOP+VT. If the bulk terminal of N-channel transistor 70 was connected to VCGBOT, leakage current from defects in the gate dielectric would cause output CG to drop and forward bias a well parasitic diode of transistor 70, thus affecting the VCGBOT supply common to the sector.

When a sector is retired, a logic high is stored in latch 50 during a retirement configuration phase. A retired sector is never accessed. NAND logic gate 44 will output a logic high select signal SEL_B, causing P-channel driver transistor 64 to be substantially non-conductive. In normal operation, configuration signal RETIRE_CFG is a logic low and POR_B is a logic high, causing latch 50 to output the previously stored value, which is a logic high for a retired sector. NOR logic gate 56 outputs a logic low, causing N-channel driver transistor 70 to be substantially non-conductive. Therefore, output signal CG is made to float.

Floating output terminal CG for the retired sector instead of biasing the output at a positive voltage prevents a potential current path from forming in the retired sector during, for example, a read operation of the array. This will allow for increased effective yield and program/erase cycling endurance. One or more defective sectors can be ignored with no impact on other sectors. Also, it is not necessary to design in extra read margin, and the design is scalable to the retiring of multiple sectors.

FIG. 3 illustrates, in schematic diagram form, split-gate memory cell 74 of the non-volatile memory of FIG. 1 in accordance with an embodiment. Split-gate memory cell 74 has a select gate for being connected to a select gate word line (not shown), a control gate for being connected to a control gate word line (not shown), a drain connected to a bit line, and a source connected to a power supply voltage terminal (not shown). A nanocrystal or SONOS layer is shown under control gate 76 by the line of dots. In one embodiment, all of the control gates of a sector of memory array 12 are connected together. All of the select gates of a row are connected to a select gate word line. All of the drain electrodes of a column are connected to a bit line.

FIG. 4 illustrates a table of control gate voltages used during operation of the non-volatile memory of FIG. 1 in accordance with an embodiment. In FIG. 4, during either a read or idle operation, the control gate for both selected sectors and unselected sectors receive 1.5 voltages, while the control gates for any retired sectors are floated. When a control gate or circuit node is floated, it is isolated from both power supply potentials, so that a voltage of the control gate can drift to a certain extent. During a program operation, the control gates of a selected sector receives 10 volts, the control gates of unselected sectors receive 1.5 volts, and the control gates of any retired sectors are floated. During an erase operation, the control gates of selected sectors receive 15 volts, control gates of unselected sectors receive 1.5 volts, and the control gates of retired sectors are floated. The control gate voltage levels in FIG. 4 are one embodiment. Other voltages may be used in other embodiments.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   an array of non-volatile memory (NVM) cells arranged in a plurality sectors;
   a control gate driver circuit having an output coupled to control gates of the NVM cells in a sector in the plurality of sectors;
   an address decoder coupled to the control gate driver circuit; and
   a latch circuit coupled between the address decoder and the control gate driver circuit, the latch circuit storing a first value, wherein based on the stored first value, the control gate driver circuit output is floating.

2. The memory of claim 1, further comprising the latch circuit storing a second value, wherein based on the stored second value, the control gate driver circuit output is driven to a read voltage during a read operation.

3. The memory of claim 2, wherein the stored first value corresponds to a retired sector and the stored second value corresponds to a non-retired sector.

4. The memory of claim 1, wherein the control gate driver circuit comprises a high side driver portion including two cascoded P-channel transistors, and a low side driver portion including two series coupled N-channel transistors.

5. The memory of claim 4, further comprising a first level shifter coupled between the address decoder and the high side driver portion of the control gate driver circuit.

6. The memory of claim 5, wherein the high side driver portion including two cascoded P-channel transistors comprises a first cascode P-channel transistor coupled in series with a second cascode P-channel transistor,
   wherein the first cascode P-channel transistor includes a first current electrode coupled to a first supply voltage, a bulk electrode coupled to the first current electrode, and a control electrode coupled to receive an output of the first level shifter, and
   wherein the second cascode P-channel transistor includes a first current electrode coupled to a second current electrode of the first cascode P-channel transistor, a bulk electrode coupled to the first current electrode, a second current electrode coupled to the output of the control gate driver circuit, and a control electrode coupled to receive a first bias voltage.

7. The memory of claim 4, further comprising a second level shifter coupled between the latch circuit and the low side driver portion of the control gate driver circuit.

8. The memory of claim 7, wherein the low side driver portion including two series coupled N-channel transistors comprises a first N-channel transistor coupled in series with a second N-channel transistor,
wherein the first N-channel transistor includes a first current electrode coupled to a second supply voltage, a bulk electrode coupled to a ground supply voltage, and a control electrode coupled to receive an output of the second level shifter, and
wherein the second N-channel transistor includes a first current electrode coupled to a second current electrode of the first N-channel transistor, a bulk electrode coupled to the first current electrode, a second current electrode coupled to the output of the control gate driver circuit, and a control electrode coupled to receive a second bias voltage.

9. The memory of claim 1, wherein the latch circuit is a set-reset (S-R) latch comprising cross-coupled NAND gates.

10. A memory comprising:
an array of non-volatile memory (NVM) cells configured in a plurality sectors;
a plurality of control gate driver circuits each having an output coupled to control gates of the NVM cells in the plurality of sectors;
a first address decoder coupled to a first control gate driver circuit in the plurality of control gate driver circuits; and
a first latch circuit coupled between the first address decoder and the first control gate driver circuit, the first latch circuit storing a first value indicative of a retired sector in the plurality of sectors, wherein based on the stored first value, the first control gate driver circuit output is floating.

11. The memory of claim 10, further comprising:
a second control gate driver circuit in the plurality of control gate driver circuits having an output coupled to control gates in a non-retired sector in the plurality of sectors; and
a second latch circuit coupled to the second control gate driver circuit, the second latch circuit storing a second value different from the first value stored in the first latch, wherein based on the stored second value, the second control gate driver circuit output is driven to a read voltage during a read operation.

12. The memory of claim 11, wherein the first and second latches are reset during a reset operation of the memory.

13. The memory of claim 11, wherein the second latch is set to the first value when the non-retired sector is configured as a second retired sector.

14. The memory of claim 11, wherein the first control gate driver circuit output is floating during a read operation in the non-retired sector.

15. The memory of claim 11, wherein each of the control gate driver circuits comprises a high side driver portion including two cascoded P-channel transistors, and a low side driver portion including two series coupled N-channel transistors.

16. The memory of claim 15, further comprising a first level shifter coupled between the first address decoder and the high side driver portion of the first control gate driver circuit, and a second level shifter coupled between the first latch circuit and the low side driver portion of the first control gate driver circuit.

17. A method of operating a memory comprising:
providing an array of non-volatile memory (NVM) cells configured in a plurality sectors;
coupling an output of a control gate driver circuit to control gates of the NVM cells in a sector in the plurality of sectors;
coupling an address decoder to the control gate driver circuit; and
storing a first value in a latch circuit coupled between the address decoder and the control gate driver circuit, wherein based on the stored first value, the control gate driver circuit output is floating.

18. The method of claim 17, wherein the first value stored in the latch circuit indicates a retired sector in the plurality of sectors.

19. The method of claim 18, wherein the control gate driver circuit output is floating during a read operation of a non-retired sector in the plurality of sectors.

20. The method of claim 17, further comprising storing a second value in the latch circuit, wherein based on the stored second value, driving the control gate driver circuit output to a read voltage during a read operation in a non-retired sector in the plurality of sectors.

* * * * *